United States Patent [19]

Finch

[11] 4,365,196

[45] Dec. 21, 1982

[54] PROXIMITY SENSING TRANSDUCER WITH SIMULATION MEANS

[76] Inventor: Colin M. Finch, Box 553, Lavington, New South Wales, Australia, 2641

[21] Appl. No.: 968,847

[22] Filed: Dec. 12, 1978

[30] Foreign Application Priority Data

Dec. 14, 1977 [AU] Australia ............................ PD2772

[51] Int. Cl.[3] ........................ G01B 7/14; G01R 35/00

[52] U.S. Cl. ...................................... 324/207; 324/202

[58] Field of Search ............... 324/207, 208, 228, 232, 324/234, 235, 236, 239, 178, 179, 202

[56] References Cited

U.S. PATENT DOCUMENTS

| | | | |
|---|---|---|---|
| 3,253,099 | 5/1966 | Hess . | |
| 3,395,341 | 7/1968 | Malaquin | 324/239 |
| 3,397,347 | 8/1968 | Hoeppel | 324/208 |
| 3,404,493 | 10/1968 | Westover et al. | 324/202 |
| 3,456,132 | 7/1969 | Dechelotte | 324/208 |
| 3,467,855 | 9/1969 | Rance | 324/236 |
| 3,491,289 | 1/1970 | Petrini | 324/208 |
| 3,633,615 | 1/1972 | Rhodes . | |
| 4,064,452 | 12/1977 | Toth | 324/202 |
| 4,066,962 | 1/1978 | Jaffe | 324/235 |

FOREIGN PATENT DOCUMENTS

| | | | |
|---|---|---|---|
| 1209730 | 9/1958 | France . | |
| 1338180 | 11/1962 | France . | |
| 5245953 | 9/1975 | Japan | 324/207 |

OTHER PUBLICATIONS

Crowe, "Calibration of Eddy-Current Systems with Simulated Signals," Materials Evaluation, Sep. 1977, pp. 59-64.

French, "Integrity Checker for Magnetic Vehicle Detector", IBM Tech. Bulletin, Jun. 1965, p. 71.

*Primary Examiner*—Gerard R. Strecker
*Assistant Examiner*—Walter E. Snow
*Attorney, Agent, or Firm*—Cushman, Darby & Cushman

[57] ABSTRACT

A transducer having a field creating coil arrangement which produces a field having a field strength minimum, having a sensing coil positioned at that field strength minimum and responsive to changes in position of that minimum resulting from the proximity of an article to the field creating coil arrangement. By observing changes in the signal output of the sensing coil, information concerning the proximity of an article to the transducer is ascertained. Preferably the transducer includes a field disturbing means associated therewith for inducing a disturbance to the field created by the field creating coil so as to cause the sensing coil to operate by either simulating the disturbance of the field that would be caused by the proximity of an article or by changing the field while the article is present. Thus the transducer may be remotely checked as to its operation.

4 Claims, 14 Drawing Figures

PROXIMITY SENSING TRANSDUCER WITH SIMULATION MEANS

FIELD OF THE INVENTION

This invention relates to a sensing transducer and relates particularly but not exclusively to such for use in railway crossing signalling installations for sensing information as to the presence or passing of a train wheel so that the crossing signalling can be controlled. Reference is made to co-pending application Ser. No. 968,846, now U.S. Pat. No. 4,283,031, where such crossing signalling is exemplified.

In its broadest aspect the invention has application to sensing of information as to articles in proximity of the transducer. An example of a use of the transducer in its broadest aspect is in the sensing of articles such as on a conveyor line so that the operations downstream of the conveyor can be adjusted to their speed of approach. Desirably, the presence velocity and direction of movement of such articles past the transducer are sensed. Preferably, the articles are such as to disturb a field emanating from the sensor when they are in proximity thereof. Typical examples of such articles are those of steel, cast iron, aluminium and the like low resistivity metals such as train wheels etc. and high resistivity magnetic materials such as ferrite etc. Such will hereinafter be referred to as articles unless reference is being intended for a specific article.

DESCRIPTION OF PRIOR ART

In the railway crossing signalling art "Live-Rail" track switches have been used to trigger the operations of warning lamps and/or gates to indicate that a train is approaching and that vehicles on the roadway should yield to the train. The "Live-Rail" track switches are operated by the train wheel and axles varying the impedance between the rails. This method has the disadvantage that any change in the track impedance caused by environmental influences such as rain or by broken rails can cause the track switch to become blind to the presence and absence of trains. Non-contact inductive loop metal detectors have been used in an attempt to overcome these problems. However these devices suffer from the following problems:

(1) low noise immunity resulting from the high impedance circuits necessary for their operation;
(2) the output signal variation being only on the order of 5% or less;
(3) a difficulty in mounting the device in an environment containing metallic or electrically conductive materials, (this is caused by the omnidirectional nature of many transducers which prohibits the presence of metal within the active range on the sides of the transducer away from the article);
(4) a detection range on the order of 50% or less of the diameter of the detection coil system; and
(5) a difficulty in remotely testing whether the transducer will operate without causing it to be blind to an article as a result of the test.

SUMMARY OF THE INVENTION

Accordingly, it is an object of the present invention to provide an improved transducer which will overcome at least one of the abovementioned problems. Particular embodiments of the invention will enable all of the above problems to be solved. In one particular embodiment the transducer when paired with another similar transducer can provide unambiguous information as to the passing of an article, as for example of its presence, its velocity and direction of movement.

Therefore, according the broadest aspect of the present invention, there is provided a transducer for detecting information as to an article in proximity thereof comprising field creating means which produces a field having a field strength minimum, sensing means positioned to be within that field strength minimum and responsive to changes in the magnitude of the field at the position of the sensing means such that when the field is disturbed by the proximity of the article, the sensing means operates to provide information as to the article.

Most preferably, there is provided field disturbing means for disturbing the field of the field creating means, to redistribute the field and change the magnitude of the field strength minimum without moving the position of the minimum whereby to cause the sensing means to operate, to provide a field checking facility for the field creating means by either simulating the disturbance of the field which would be caused by the proximity of the article or by changing the field while the article is in proximity. Most preferably, the field is a high frequency magnetic field, but it is to be understood that the invention includes fields created by any means, such as by any electromagnetic radiation.

BRIEF DESCRIPTION OF THE DRAWINGS

In order that the invention can be more clearly ascertained, preferred embodiments will now be described with reference to the accompanying drawings wherein:-

DESCRIPTION OF THE PREFERRED EMBODIMENTS

Figures 1, 2, 3:
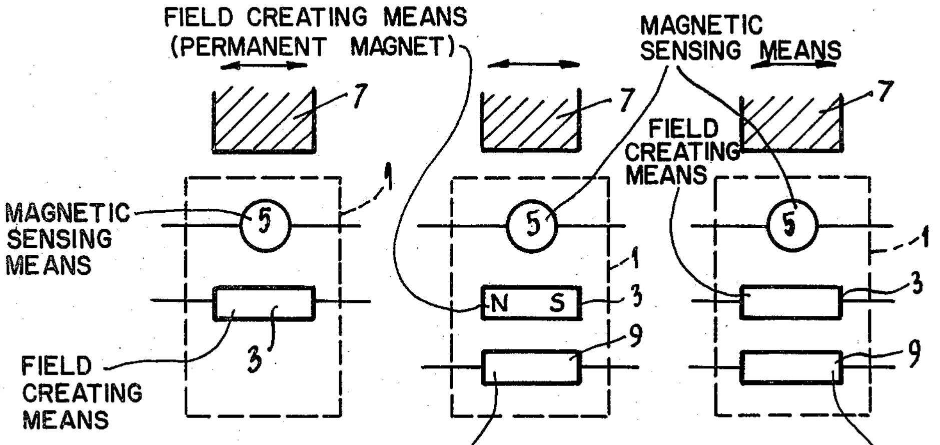
FIG. 1 is a schematic diagram illustrating the underlying concepts of the present invention.
FIG. 2 is a schematic diagram illustrating the underlying concepts of the present invention.
FIG. 3 is a schematic diagram illustrating the underlying concepts of the present invention.

Referring firstly to FIG. 1 there is shown a schematic diagram of transducer illustrating the concepts of the present invention. The transducer comprises a magnetic field creating means 3 and a magnetic sensing means 5, such as a Reed-Relay, a Hall-Effect device, or a magnetic pick-up coil or like sensing means, which will provide an indication if the field around the sensing means changes. The magnetic field creating means 3 can be a compound coil energisable by either A.C. or D.C. and having sufficient flux created thereby so that the field extends into the path of an article 7 to be detected by the transducer 1 and also across the sensing means 5.

The compound coil 3 consists of two coils arranged so that the field created by each of them opposes that of the other, thus producing in the space between the coils a field strength minimum. The sensing means 5 is then situated in the field strength minimum. By this means a steep field strength gradient is achieved that surrounds the sensing means 5.

If the article 7 is brought into proximity of the transducer 1, the field created by the field creating means 3 is disturbed so that the field strength minimum is shifted in position and thus there is a large change in the field coupling with the sensing means 5. This change is then detected by the sensing means 5 and used to indicate information as to the presence of the article 7. The relationship of the field and sensing means will be explained in greater detail with respect to FIGS. 10–14. In the case where the sensing means 5 is a Reed-Relay it is positioned so that it will be in one of its states (i.e. on or off) when the article 7 is not present and so that when the article is present the field will be changed such that it will change to the other of its states.

If the field sensing means 5 is a pick-up coil there will be a change in voltage across its two leads and this can be used to provide information as to the article 7. Similarly, if the sensing means 5 is a Hall-Effect device a corresponding change will occur and this can be used to provide information as to the article 7.

Referring next to FIG. 2 there is shown a second schematic diagram illustrating the underlying concepts of the present invention, wherein like parts to those in the FIG. 1 have identical numbers. In this embodiment the field creating means 3 is a pair of permanent magnets arranged to produce a field in like manner to that described with reference to FIG. 1. The FIG. 2 arrangement then operates in the same manner as that described previously, however, it has circuit means further comprising a field disturbing means 9 which creates a field to oppose the field created by the field creating means 3 thereby increasing the field strength of the field strength minimum to a known value. Thus by activating the additional field disturbing means 9, it is possible to check the operation of the transducer 1 both electrically and magnetically to see that both the electrical and magnetic circuits are operative up to the moment of detecting the article 7. Further, if article 7 should be in proximity causing the sensing means 5 to provide certain information as to the presence of the article 7, activation of the additional field creating means 9 will cause the sensing means 5 to change. In the case where it is a Reed-Relay it will change to its other state, provided that the field created by the field creating means 3 is cancelled or opposed. If the sensing means 5 is a Hall-Effect device or a pick-up coil then the change on operation of the additional field creating means 9 can be either an increase in the output or a reduction. Preferably, the additional field creating means 9 reduces the field of the field creating means 3 rather than adds to it in order to cause the sensing means 5 to change. Further, when it reduces the field it inhibits reaching magnetic saturation of any cores on which the coils are wound or magnetic saturation of the sensing means 5. It will be apparent that the checking facility provided by the additional field creating means 9 is in contrast to any checking which can be provided by a switch, such as a Live-Rail track switch, as the Live-Rail track switch cannot be checked while the article, such as a train, is present. Further, the system of creating a further field by the additional field creating means 9 simultaneously checks the magnetic circuit so there is a double check.

The arrangement shown in FIG. 3 is substantially identical to that as shown in FIG. 2 except that instead of having the field creating means 3 as a pair of permanent magnets it is a compound coil energised by either A.C. or D.C.

Figure 4:
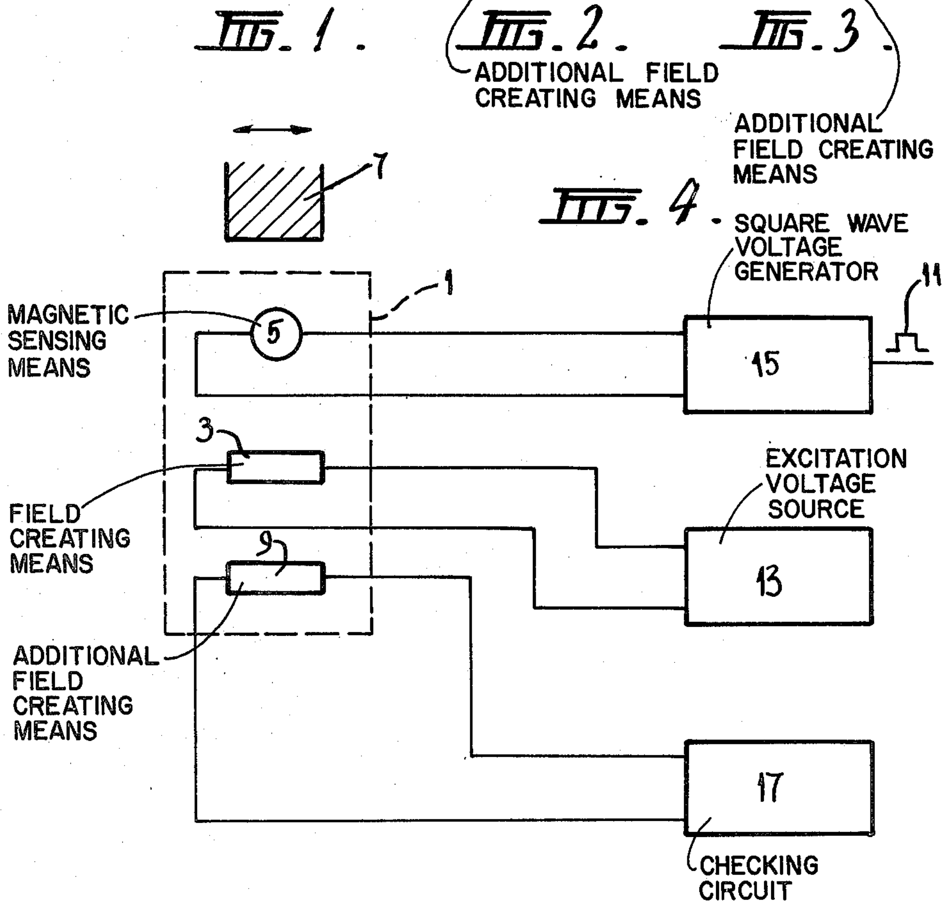
FIG. 4 is a block diagram of a first embodiment of the present invention.

FIG. 4 shows a block circuit diagram of electronic circuitry attached to the transducer 1 to provide an output signal 11 on the presence of the article 7. The circuitry has a circuit 13 for providing an excitation voltage to the field creating means 3 so as to provide the necessary field. The excitation means may comprise an oscillator. A square wave voltage generator 15 is connected to the sensor 5 to generate the output signal 11 when the article 7 is in proximity. A checking circuit 17 is connected with the additional field creating means 9 so as to excite that means 9 and provide the necessary checking field. The square wave voltage generator 15 may have circuitry which provides output signal 11 at two voltage levels a high level being the article present level a low level being the checking level when the article is not present.

In such circumstances if the circuit is in a checking mode and an article 7 should come into proximity then the higher output 11 can be recognized as the real article present signal. If the article is not present and checking is required then logic circuitry can be used to provide only the lower level signal 11.

Conversely a low level can be used to signal article present and a high level to signal checking is in progress.

Figure 6:
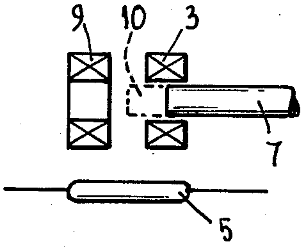
FIG. 6 is a plan view of the embodiment shown in FIG. 5.
Figure 5:
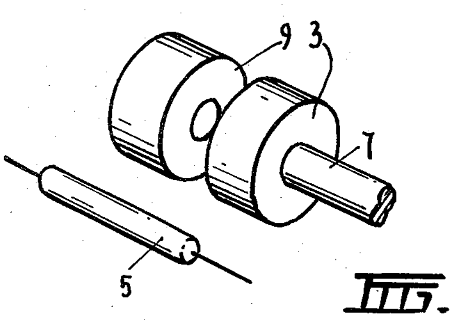
FIG. 5 is a diagrammatic perspective view of the second embodiment of the present invention.

Referring to FIGS. 5 and 6 there is shown an article 7 (which comprises a plunger member). The field creating means 3 comprises a toroidal coil in which the article 7 can be received through the centre. The additional field creating means 9 is a similar toroidal coil axially aligned with the field creating means 3. Sensing means 5 is arranged to extend parallel with the central axis of the coils 9 and 3 and desirably in this embodiment comprises a Reed-Relay.

In use, the field creating means 3 provides a field which encompasses the sensing means 5 when the article 7 is in the full line position shown in FIG. 6. The sensing means 5 will be in one of its states either on or off. When the article 7 is inserted into the coil of the sensing means 5 to the position shown in dotted lines and indicated by numeral 10 the flux surrounding the sensing means 5 then changes and the sensing means 5 provides an output which provides information as to the presence of the article 7. The additional field creating means 9 is activated when the transducer is to be checked and the field created thereby disturbs the field created by the field creating means 3 and causes the sensing means 5 to change to the other of its states.

Figure 7:
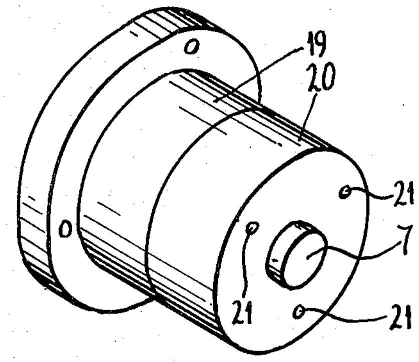
FIG. 7 is a front perspective view of a more practical embodiment of a transducer shown generally in FIG. 5.
Figure 8:
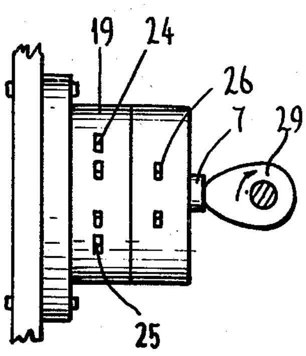
FIG. 8 is a side view of the transducer shown in FIG. 7.
Figure 9:
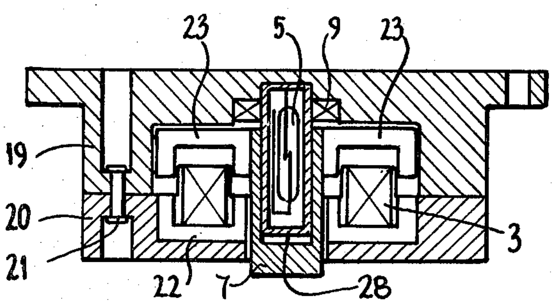
FIG. 9 is a sectional plan view taken along line 9—9 of the transducer shown in FIG. 8.
Figure 10:
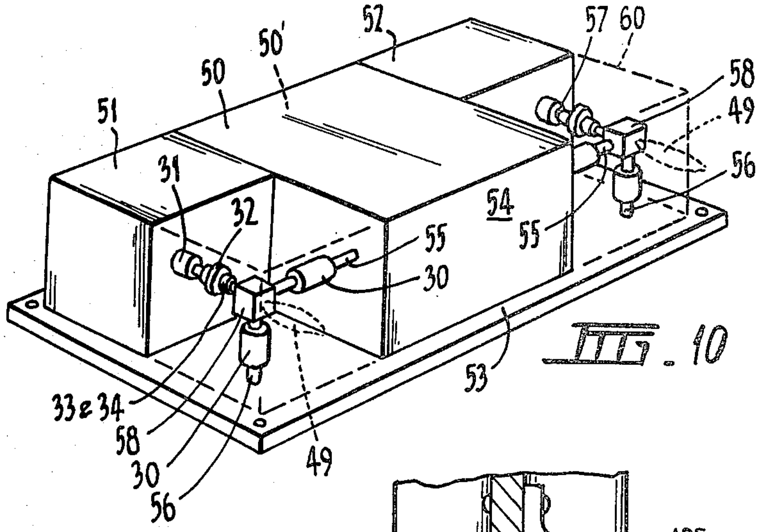
FIG. 10 is a front perspective view of a third and preferred embodiment of a transducer according to the present invention for use in railway signalling, which provides information as to the passing of a train wheel.
Figure 11:
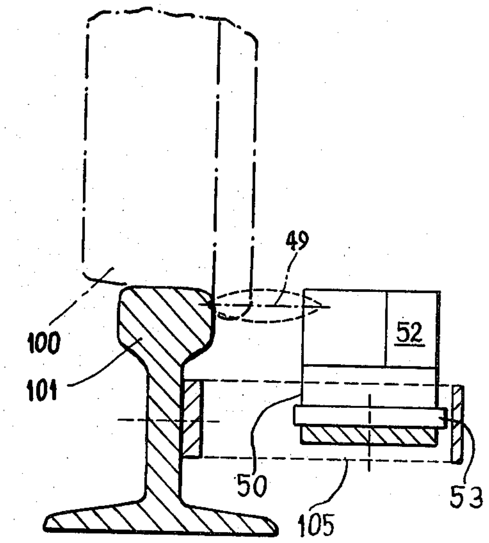
FIG. 11 is a side view of the transducer shown in FIG. 10 mounted adjacent to a railway line.

FIGS. 7, 8 and 9 show a practical realization of the transducer shown in FIGS. 5 and 6. The transducer has a casing made of plastic having a cup-shaped portion 19 and a mating cup-shape portion 20. The portions 19 and 20 are held together by rivets.

A plunger 7 passes through a central opening in the end of portion 20 and has the general shape as shown in FIG. 9. The plunger 7 is an elongate closed end tube—the closed end being outermost. A pot-core 22 of annular shape is fitted within the portion 20 and has field creating coils 3 fitted therein. The field creating coils 3 are of annular configuration and may be toroidally wound. A similar toroidal shape core 23 to that of core 22 is fixed to the plunger 7 so that it can slide within the portion 19 towards and away from the pot-core 22 as the plunger 7 moves into and out of the transducer. An annular shaped additional field creating means 9 is mounted within portion 19 so that the central axis thereof coincides with the central longitudinal axis of plunger 7. Terminals 24, 25 and 26 are provided in portions 19 and 20 for the leads of the additional field coil 9 the sensing means 5, and the field creating coils 3. The sensor 5 is fitted within the plunger 7 and fixed to the rear of the portion 19, within a casing 28 and the field creating coils 3.

In use the transducer is mounted adjacent to a cam-shaft 29 so that the cam can engage with the plunger 7. The field creating coils 3 are activated which causes the field in the ferrite pot core 22 and 23 to draw them together thus urging the plunger 7 outwardly from the transducer. The cam 29 in turn opposes the force created by the field urging the pot-cores 22 and 23 together and moves pot core 23 in accordance with its angular position.

In the position shown in FIG. 9 where the plunger 7 is urged fully into the transducer the flux field created by coils 3 acts on the Reed-Relay causing it to assume one of its operative states. When the plunger 7 is withdrawn closing the pot cores 22 and 23 the field will be contained by the cores and the Reed-Relay 5 will change to the other of its states. To test the transducer a voltage is applied to the additional field creating coil 9 to oppose the field created by the field creating coils 3 thus causing the Reed-Relay 5 to change to the other of its states. Similarly, if the plunger 7 is moved out of the transducer such that the pot-coils 22 and 23 are closed, energising the additional field creating coil 9 will cause the Reed-Relay 5 to change to the other of its states. If the magnetic force of attraction between the pot coils 22 and 23 is insufficient suitable spring means may be inserted to assist such movement.

Referring now to FIGS. 10, 11, 12 and 13 there is shown a particularly preferred embodiment of the transducer according to the present invention for use in the railway signalling art (for placing next to a train line for detecting information as to the proximity of a train wheel or other field disturbing means extending from the train (hereinafter referred to as train wheel). The information is to the presence, velocity and direction of movement of a train wheel. The transducer shown generally by numeral 50 has two identical transducer elements 51 and 52 spaced apart a distance less than the diameter of the train wheel. Such spacing is important because the two transducers 51 and 52 are used to provide signals for subsequently providing unambiguous information as to the presence, velocity and direction of movement of the train wheel. If the transducers were spaced greater than the diameter of the wheel then it would be difficult to relate whether the wheel had passed the two transducers 51 and 52 or dwelled therebetween.

The arrangement of the field creating means of this embodiment is particularly advantageous because it enables a field to emanate from the front of the respective transducers 51 and 52 over a very narrow area. The particular arrangement produces an emanating system threshold field which is in the shape of a cylindrical candle flame 49.

Transducers 51 and 52 are spaced apart by mounting on a base 53, with a housing 54 for electronic circuitry 50′ therebetween.

Each transducer 51 and 52 comprises three cores 55, 56 and 57 of elongate cylindrical shape. The cores 55, 56 and 57 are arranged to be at right angles to one another as shown and they are held in this alignment by a spider 58. The ends of the cores 55, 56 and 57 are retained against walls of a transducer box 60 by glueing thereto. The transducer box is shown clearly by dotted lines 60 in FIG. 10. Each of the cores 55, 56 and 57 has coils wound thereon. Core 55 has a field creating coil 30 wound thereon and core 56 has a similar field creating coil 30 wound thereon. The two coils 30 are electrically connected in series to form a field creating means as shown by the circuit diagram of FIG. 13. Core 57 has four coils wound thereon. It has a field disturbing coil 32 wound at one end near the spider 58 and coil 32 is wound over sensor coils 33 and 34. Coils 33 and 34 can be considered as a single coil with a centre tap forming a sensing means. At the other end of core 57 is a field pick-up coil 31. Coils 31 and 32 are connected in series as shown by the circuit diagram of FIG. 13 to form the field disturbing means.

The cores and the coils including the spider 58 are embedded in an epoxy resin moulding to provide rigidity and protection against ingress of moisture. The sensor coils 33 and 34 are situated at a point on core 57 such that they are in a minima of the field created by the field creating coils 30. If desired the sensor coils 33 and 34 can be mounted on the core 57 to be inside of the spider 58, so they will be at the junction of the axis of the cores 55, 56 and 57. The field disturbing coil 32 is situated on the former 57 at a point where there will be a high constant field as a result of the field generated by the coils 30.

The coils 30 are of equal turns and size and are spaced an equal distance from the spider 58. When coils 30 are correctly phased, and there is no wheel present, i.e. no article to disturb the flux, there will be a null-point in the flux at the point where the axis of coils 55, 56 and 57 intersect. Should the fields of coils 30 be moved so as to disturb this symmetry, a signal will be generated in sensor coils 33 and 34 by the method of "shifting" the null-point by disturbing the field created by coils 30. The field is effectively strongest most sensitive to disturbance along the longitudinal axis of core 57. If sensor coils 33 and 34 are correctly positioned and no train wheel is present there will be no signal output. With any disturbance of the field along the axis of core 57 there will be an output generated by the coils 33 and 34. Such output is proportional to the amount of field distortion caused by a train wheel. The locus of the position of an article in space that causes the detector output 11 to exceed a particular level forms a solid similar to the shape of a candle flame with the longitudinal axis of the locus being an extension of core 57. Coil 31, as previously stated, is placed in a position where there is a high field strength independent of whether there is a train wheel present or not. Accordingly, coil 31 always provides an output voltage proportional to the magnitude of the voltage source supplying coils 30. Preferably such supply voltage is an A.C. voltage at approximately 4 KHz.

Figure 13:
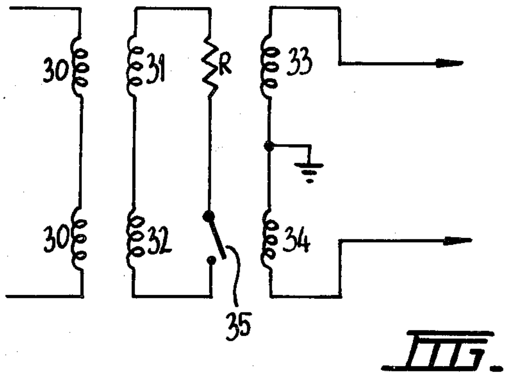
FIG. 13 is a circuit diagram of the coils of the transducer of FIG. 11.

All coils are interconnected in the manner shown in FIG. 13 and it can be seen that coils 31 and 32 of the field disturbing means are connected in series with a resistance R and a switch 35. If switch 35 is closed and resistance R is small the voltage across coil 31 is applied to coil 32 and injects a field into the field strength minimum increasing the strength of that minimum which results in coils 33 and 34 providing a signal output simulating that caused by the presence of an article such as a train wheel. The magnitude of this simulated article field is a function of the value of R and may be adjusted to suit. The presence of this simulated article field is used to check the transducer as described for all the previous embodiments.

The magnitude of this simulated article field is purposely set to provide a lower signal in the sensor coils 33 and 34 than that which will be generated by the presence of an article such as the train wheel at a maximum required distance, along the longitudinal axis of core 57 away from the transducer. Hereinafter the level of this signal will be entitled level $\underline{I}$. A signal caused by the presence of the train wheel will hereinafter be entitled level $\underline{II}$ and will always be greater than that of level 1.

Figure 12:
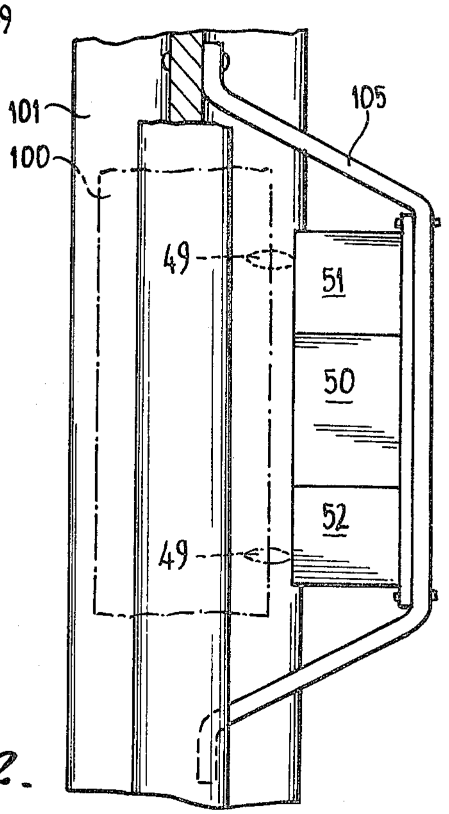
FIG. 12 is a plan view of the transducer shown in FIG. 11.

To extract unambiguous information, the train wheel has to be sufficiently close to the transducers 51 and 52 to always create a level 11 signal. This is achieved by mounting the transducer 50 with its base 53 fitted to a bracket 105 so that both of the transducers 51 and 52 have the fields directed towards an edge of a rail 101 and so that a train wheel 100 can disturb those fields when it is in proximity of the respective transducers 51 and 52. The bracket 105 is of top-hat shape, as shown in FIG. 12, and is fastened to the upstanding web of the rail 101 by suitable bolts.

Figure 14:
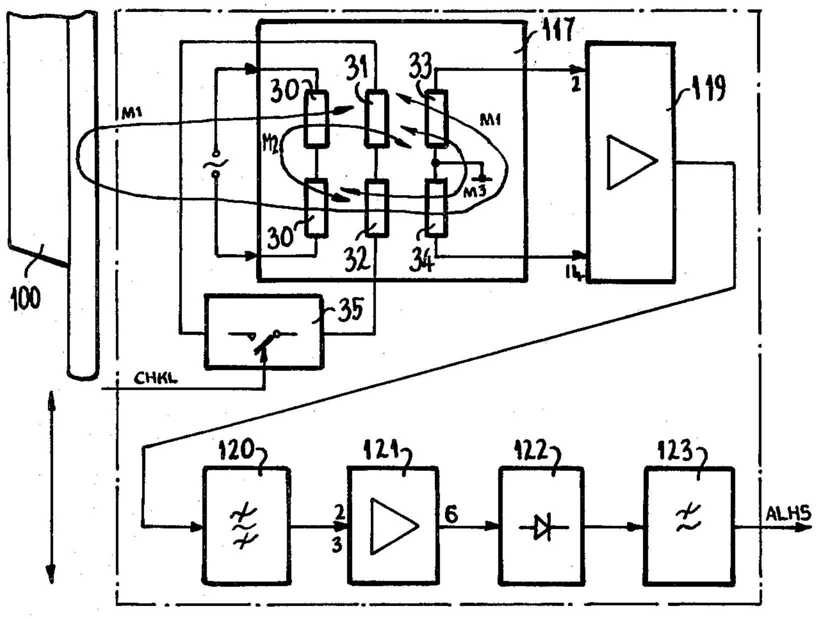
FIG. 14 is a block circuit diagram of circuitry used for providing an output signal from a transducer according to the present invention.

The signal provided by the output sensing coils 33 and 34 may be subject to interference signals and accordingly it is processed in the circuit of FIG. 14 to provide a usable signal. The circuits associated with each of the transducers 51 and 52 are identical-only one being shown in FIG. 14. When the train wheel 100 is within the range of the flux emanating from transducer 51 it will effect the magnetic coupling path represented by M1 in FIG. 14 which links with coils 33 and 34 and the resulting field movement produces an output voltage which is applied to a video amplifier 119 on pins 2 and 14. The video amplifier 119 is type (NE592N). The output of amplifier 119 pins 7 and 8 are applied to a band pass filter 120 which has a low frequency cut-off point at 3 KHz and a high frequency cut-off at 5 KHz. The filtered signal is further amplified by applying it to differential amplifier 121 via pins 2 and 3 (NE531N). The output of which (pin 6) provides a signal suitable for detection by a diode 122 (1N914) and a filter 123 which has a low-pass characteristic with a cut-off frequency of 400 Hz. Thus, the presence of the wheel 100 affecting the coupling M1 will produce a stable voltage at the output of filter 123. The magnitude of this voltage will be proportional to the distance between the wheel 100 and the sensor coil 33 and 34.

The voltage level $\underline{I}$ and level $\underline{II}$ can be fed into logic circuitry so that level $\underline{I}$ signals will not be processed as information other than purely checking information. As level $\underline{II}$ signals are higher than that of level $\underline{I}$ they will override level $\underline{I}$ signals and be passed to subsequent circuitry to determine the wanted information concerning the train wheel.

As a train wheel passes each transducer the output signal at filter 123 will be a rising voltage which will pass through level $\underline{I}$ before reaching level $\underline{II}$. Thus, until it exceeds a level higher than level $\underline{I}$ the subsequent circuitry will not be activated.

To determine velocity of the train wheel relative to the transducer 50 the time difference between the output signals for transducers 51 and 52 is ascertained and by knowing the spacing of the two transducers 51 and 52 the velocity can then be determined. The order in which the transducers 51 and 52 generate the output signals will determine the approach direction of the train wheel. The presence of a level $\underline{II}$ signal will signal the presence of the train wheel.

I claim:

1. A transducer for detecting information as to an article in proximity thereof, comprising:

a field creating coil for creating a field, sensing means comprising a pick-up coil positioned to be within the field and responsive to changes in the field such that when the field is disturbed by the proximity of the article, the sensing means provides information as to the article, said field creating coil including two parts, one part being positioned around an elongate core and the other part being similarly positioned on another elongate core, the longitudinal axes of both of said cores being at right angles to one another, and wherein said pick-up coil is positioned around a further elongate core, said further core being at right angles to both of the other cores with all core axes intersecting, so that the pick-up coil is situated in a field strength minimum created by the interaction of the fields emanating from the parts of said field creating coil, and a field disturbing coil having two parts, one part being mounted co-axially with said pick-up coil at a position where the field has minimum strength when an article is not in proximity to the transducer and the other part being at a position other than where the field has minimum strength and wherein said parts of said field disturbing coil are electrically interconnected with a resistance and a switch so that when the switch is closed the field is redistributed and the voltage induced in the pick-up coil changes, thereby simulating the presence of an article.

2. A transducer for detecting information as to an article in proximity thereof, comprising:

a field creating coil, sensing means comprising a pick-up coil positioned to be within that field and responsive to changes in that field such that when it is disturbed by the proximity of the article, the sensing means operates to provide information as to the article, and wherein said field creating coil includes two parts, one part being wound around an elongate core and the other part being similarly wound on another elongate core, the longitudinal axis of both of said cores being fixed at right angles to one another, and wherein said pick-up coil is wound around a further elongate core, said further core being fixed at right angles to both of the other cores with all core axes intersecting so that the pick-up coil is situated in a field strength minimum created by the interaction of the fields emanating from the parts of the field creating coils, and a field disturbing coil having two parts, one part being mounted coaxially with said pick-up coil at a position where the field has minimum strength when an article is not in proximity to the transducer and the other part is at a position other than where the field has minimum strength and wherein said parts of said field disturbing coil are electrically interconnected with a resistance and a switch, so that when the switch is closed the field is redistributed and the voltage induced in the pick-up coil will change thereby simulating the presence of an article, the value of the resistance being chosen such that the voltage induced in the pick-up coil is known and will be different from the voltage induced when an article is in proximity of the transducer so that the voltage induced by the proximity of an article can be distinguished from the voltage induced when the presence of an article is merely simulated.

3. A transducer as claimed in claim 2 wherein another of said transducers is provided and both are spaced apart less than the length of an article to be detected whereby to provide a sensor unit which can provide two sets of information under the control of said field disturbing means in each transducer.

4. A method for detecting information as to a simulated article comprising:

(a) creating first and second fields at respectively first and second positions whereat a simulated article is to be detected;

(b) providing first and second field sensing means at predetermined spatial positions within the first and second fields respectively, both field sensing means being responsive to changes in the strength of their respective fields at their respective positions;

(c) creating a known redistribution of each of said fields without substantially changing the power in the field in a manner whereby the redistribution of the field is substantially identical to the redistribution that would be caused by an article in proximity to the field;

(d) observing the response of each field sensing means to the redistribution of its respective field;

(e) correlating the nature of the responses of said sensing means to the nature of the input creating the known redistribution of the field, whereby information is detected at respectively each of said first and second positions as the simulated article passes the two positions in proximity to the respective fields; and (f) using the information from the two positions to ascertain any of the following:

(1) presence of the simulated article;

(2) direction of movement of the simulated article, and (3) velocity of the simulated article.

* * * * *